United States Patent
Wang

[19]

[11] Patent Number: 6,130,564
[45] Date of Patent: Oct. 10, 2000

[54] HIGH FREQUENCY DIVIDER CIRCUIT

[75] Inventor: Hongmo Wang, Watchung, N.J.

[73] Assignee: Lucent Technologies Inc., Murray Hill, N.J.

[21] Appl. No.: 09/294,695

[22] Filed: Apr. 19, 1999

[51] Int. Cl.$^7$ ................................................. H03B 19/00
[52] U.S. Cl. ...................... 327/117; 327/114; 327/116; 327/119; 327/118; 327/122; 377/47; 377/48
[58] Field of Search .......................... 327/113–119, 122, 327/199–201, 211, 299; 377/47, 48

[56] References Cited

U.S. PATENT DOCUMENTS

| | | | |
|---|---|---|---|
| 3,930,169 | 12/1975 | Kuhn, Jr. ................................. | 377/47 |
| 5,003,566 | 3/1991 | Gabillard et al. ....................... | 377/117 |
| 5,821,639 | 10/1998 | Tailliet ..................................... | 327/44 |
| 5,926,045 | 7/1999 | Kwon ....................................... | 327/114 |
| 5,930,322 | 7/1999 | Yang et al. .............................. | 377/48 |
| 6,023,182 | 2/2000 | Milshtein et al. ....................... | 327/299 |
| 6,041,093 | 3/2000 | Cho .......................................... | 347/47 |
| 6,060,922 | 5/2000 | Chow et al. ............................. | 327/175 |

*Primary Examiner*—Kenneth B. Wells
*Assistant Examiner*—Long Nguyen

[57] ABSTRACT

A frequency divider circuit operable at high frequencies for producing an output signal having a frequency value equal to substantially half the frequency value of a clock signal from which the circuit operates. The circuit includes a first transistor branch, an inventor and a second transistor branch. The first transistor branch is connected to an input of the inventor and the second transistor branch is connected to an output of the inventor. The first transistor branch receives a plurality of input signals including the clock signal, a compliment of the clock signal, and the circuit output signal and produces an input signal which is provided to the inventor. The second transistor branch receives a plurality of inputs including the compliment of the clock signal, the clock signal and the inventor output signal, and produces the circuit output signal. The circuit is configured such that the next inventor state is always available for conveyance to the output signal upon a change in the clock signal.

8 Claims, 2 Drawing Sheets

HIGH FREQUENCY DIVIDER CIRCUIT

BACKGROUND OF THE INVENTION

1. Field of the Invention

The present invention relates to frequency synthesizers capable of operating at high frequencies. More particularly, the present invention pertains to a frequency divider circuit for use in conjunction with a voltage-controlled oscillator in a frequency synthesizer.

2. Description of the Related Art

Frequency synthesizers are essential components of communication receivers. Most known frequency synthesizers include two primary circuits: a voltage controlled oscillator (VCO), and a prescaler which is typically configured from a frequency divider circuit. The two circuits (VCO and frequency divider) are connected within a phase-locked loop arrangement. Known frequency divider circuits are shown in FIGS. 1 and 2. As depicted in FIG. 1, a simple frequency divider circuit is implemented by a plurality of series-connected invertors I1, I2 and I3. A clock signal (CK) having a particular frequency is applied to inventor I1 and the complement of the clock signal CK (pronounced CK BAR and referred to hereinafter as "CKB") is applied to inventor I3 for producing an output signal having a frequency substantially half of CK, i.e. CK/2. The clock signals CK and CKB are commonly applied, as shown in FIG. 2, to a gate terminal of a MOSFET transistor that is connected in series with a corresponding inventor.

The drawbacks of the frequency divider circuits of FIGS. 1 and 2 is that the inventor switching speeds are limited. In other words, the speed at which the state of the inventor can change is limited, thus rendering a frequency synthesizer incorporating the frequency divider circuit unacceptable for high frequency use, i.e., for use with high frequency clock signals.

SUMMARY OF THE INVENTION

In accordance with the present invention, a frequency divider circuit is disclosed which is suitable for use in a frequency synthesizer for operation over a wide range of frequencies including high frequency signals. The frequency divider circuit includes an inventor connected between a first transistor branch and a second transistor branch. The inventive circuit operates from a clock signal and produces an output signal having a frequency substantially half the value of the clock frequency. The first transistor branch receives as inputs the clock signal, a complement of the clock signal, and the circuit output signal and outputs a control signal to the inventor. The inventor outputs a signal opposite in value to the value of the first branch output. Thus, if the first transistor branch outputs a signal of a logic "1", the inventor outputs a logic "0" and vice versa. The second transistor branch receives as inputs the clock signal, clock signal complement, and inventor output signal and outputs the divider circuit output signal. In this manner the state of the inventor (logic "1" or "0") is always present at the output of the inventor and can be provided to the second transistor branch almost simultaneously with a change in the clock signal value. The operating speed of the frequency divider circuit is thus substantially increased.

In a preferred embodiment, the first transistor branch contains three MOSFET transistors, namely a PMOS and two NMOS transistors, with the PMOS transistor receiving, at its gate terminal, the clock signal, and the NMOS transistors receiving the circuit output signal and clock complement, respectively. The second transistor branch in the preferred embodiment also includes three transistors, namely a PMOS and two NMOS transistors. The PMOS transistor of the second transistor branch receives, at its gate terminal, the complement clock signal, and the NMOS transistors receive the inventor output signal and the clock signal, respectively.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
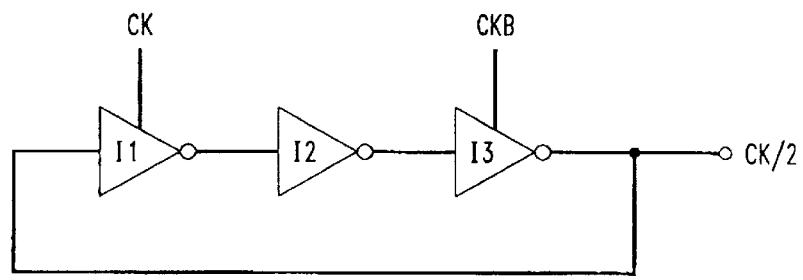
FIG. 1 is a prior art frequency divider circuit.
Figure 2:
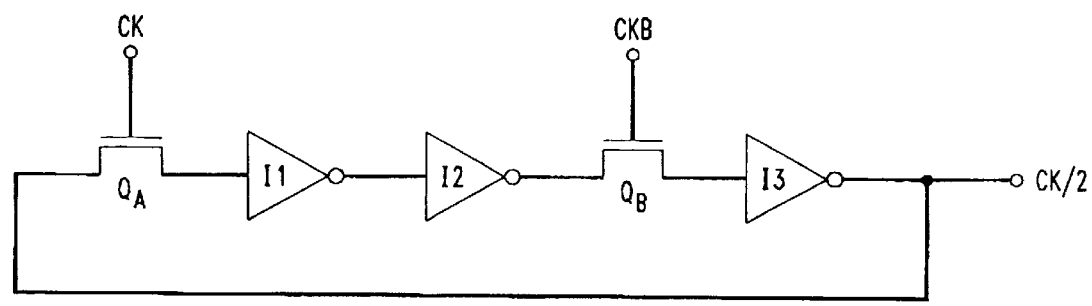
FIG. 2 is an equivalent illustration of the prior art inventor circuit of FIG. 1.
Figure 3:
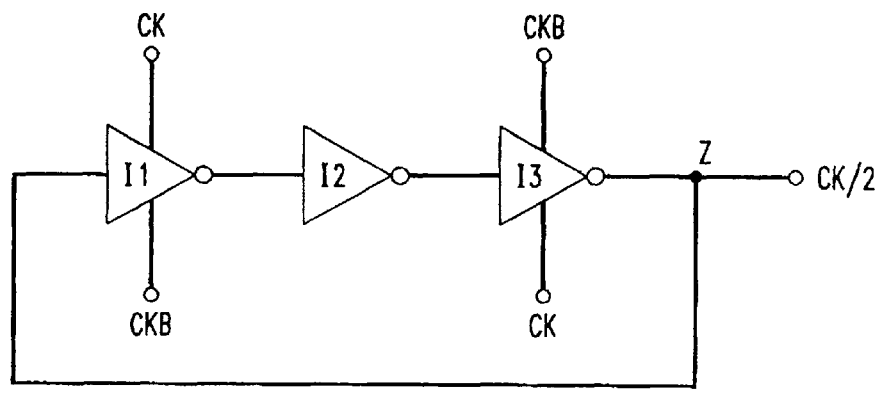
FIG. 3 is a functional block diagram of a high frequency divider circuit in accordance with the present invention.
Figure 4:
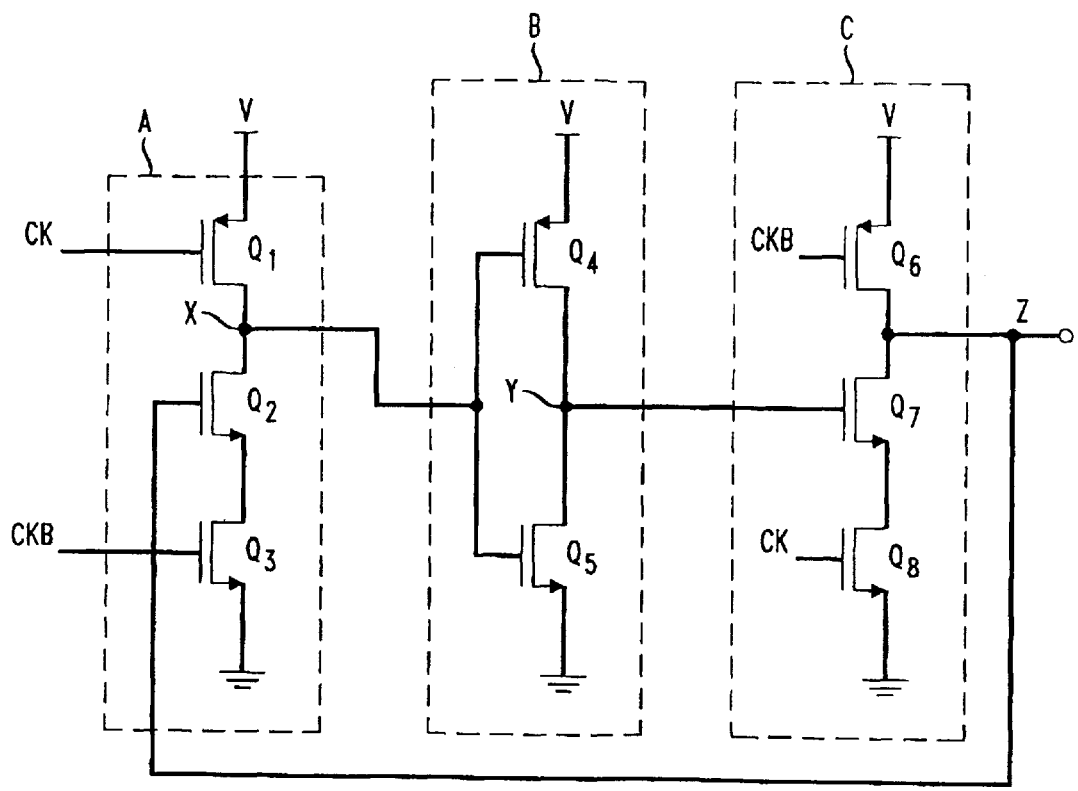
FIG. 4 is a schematic equivalent representation of the high frequency invertor circuit of FIG. 3.

The inventive frequency divider circuit is depicted in functional block form in FIG. 3 and schematically in FIG. 4. As shown in FIG. 3, the frequency divider circuit includes a standard invertor I2 and a pair of modified invertors I1 and I3 serially disposed on either side of I2 and electrically connected thereto. Invertor I2 operates in a manner well-known to those having ordinary skill in the art and has an output signal opposite in value to its input signal value. Thus, invertor I2 receives a single input signal having a value equivalent to a logic "1" or a logic "0", and outputs an output signal having a value opposite (i.e. logic "0" or logic "1") to the input signal value. The frequency divider circuit outputs a signal Z having a particular frequency.

Unlike invertor I2, modified invertors I1 and I3 each receive a plurality of input signals and produce a single output signal. For example, invertor I1 receives as inputs a clock signal (CK), a logic complement of the clock signal (CKB) having the same frequency as CK, and the circuit output signal Z which is fed back to the invertor I1, and produces a single output signal which is used by invertor I2 as an input signal. Similarly, modified invertor I3 receives as inputs CK, CKB, and the output of invertor I2, and produces the circuit output signal Z. The output signal Z has a frequency substantially equal to one-half of the frequency of the clock signal.

In FIG. 4, each invertor I1, I2 and I3 is represented by a transistor branch labeled "A", "B" and "C", respectively. Transistor branch "A" is referred to herein as a first transistor branch, and transistor branch "C" is referred to herein as a second transistor branch. As is known in the art, invertor I2 is represented by CMOS transistors having a PMOS transistor Q4 and an NMOS transistor Q5. Each transistor has a gate terminal, a source terminal and a drain terminal. As explained below, the gate terminals of invertor I2 are connected to each other and receive a common input signal having a value of either a logic "1" or a logic "0". The source terminals of invertor I2 are also connected to each other and output a signal having a value opposite to the invertor input signal. Thus, when I2 receives a logic "0" as an input, it outputs a logic "1".

With continued reference to FIG. 4, first transistor branch "A" is connected between a voltage source "V", representing a logic "1", and a common ground, representing a logic "0". Branch A includes three MOSFET transistors, Q1, Q2 and Q3, each having gate, drain and source terminals and each having an "on-resistance". In the preferred embodiment, transistor Q1 is a PMOS transistor, transistors Q2 and Q3 are NMOS transistors and Q1 has an on-resistance value higher than the sum of the on-resistances of Q2 and Q3. As shown, the source terminals Q1 and Q2 are connected together at a node "X" to which the input of invertor I2 is connected. In other words, the gate terminals of transistors Q4 and Q5 are connected to the first transistor branch "A" at node "X" as to receive the output signal of transistor branch "A" as an input. First transistor branch "A" receives three separate input signals. In particular, a clock signal (CK) having a frequency associated therewith is provided to the gate terminal of transistor Q1, and the logic complement (CKB) of the clock signal is provided to the gate terminal of transistor Q3. The gate terminal of transistor Q2 receives, as an input, the output signal Z generated by the frequency divider circuit.

MOSFET transistors Q1, Q2 and Q3 operate in a known manner such that, when the value of signal CKB is high, i.e. a logic "1", NMOS transistor Q3 will "turn on" and conduct. Since transistor Q1 is a PMOS transistor, it operates in an opposite manner to that of Q3 so that, when signal CK is a logic "1", transistor Q1 will remain "off" but, when signal CK is a logic "0" then transistor Q1 will turn on and conduct.

The second transistor branch "C", which makes up modified invertor I3, is identical in topology to transistor branch "A". Branch "C" receives a plurality of input signals including the output from invertor I2, and outputs the frequency divider output signal Z. Like first transistor branch "A", transistor branch "C" includes three MOSFET transistors Q6, Q7 and Q8 have on-resistance values which, preferably, are such that the on-resistance of Q6 is larger than the sum of the on-resistances of Q7 and Q8. Transistor Q6 is preferably a PMOS transistor which receives, at its gate terminal, the complement clock signal CKB, and transistor Q8 is preferably a NMOS transistor which receives the clock signal CK at its gate terminal. Transistor Q7 has its source terminal connected to the source terminal of transistor Q6 and produces the common output signal Z. The gate terminal of transistor Q7 is connected to node Y, i.e. to the output of invertor I2, and receives the invertor output signal as an input to its gate terminal.

The operation of the inventive frequency divider circuit will now be described. The first and second transistor branches allow the invertor I2 to hold its current state until the clock signal CK changes, at which time the invertor state is provided to I3. Inasmuch as Q1 is a PMOS transistor, when CK is high, Q1 is "off", i.e. non-conducting, and Q3 is also "off" (since when CK is high, CKB is low). Thus, when both Q1 and Q3 are "off", any charge at node X is held in place because there is no discharge path through either Q1 or Q3. When CK goes low, both Q1 and Q3 turn on, whereby the value at node X becomes solely dependent on the signal applied to the gate terminal of transistor Q2, i.e. signal Z. As a consequence, if signal Z is low, then Q2 will turn "off" and node X will be raised to a value proximate voltage V (i.e. the value of logic "1"). If, on the other hand, signal Z is high, then Q2 will turn "on" thus reducing the value at node X to a value close to common ground (close to logic "0") through Q3. This occurs due to the value relationship of the on-resistances of Q1, Q2 and Q3 where, as stated above, the on-resistance of Q1 is larger than the sum of the on-resistances of Q2 and Q3. As for the second transistor branch "C", this branch operates in a similar manner to the first transistor branch except that the clock phase is opposite to that of the first branch A. In other words, the complement clock signal CKB is applied to transistor Q6 in transistor branch C and the clock signal is applied to transistor Q8.

As stated above, the output signal Z has a frequency value substantially equal to half of the clock frequency value, i.e. CK/2. As an example, if CK/2 is a logic "1", then when CK is low with CKB high, transistors Q1 and Q3 will turn on and the value at node X will be a logic "0" because transistor Q2 will turn "on" from the high value of CK/2, i.e. from the high value of output signal Z. By applying a low value to the input of invertor I2, the output voltage at node Y will be a logic "1". Note that as invertor I2 does not receive a clock signal for operation, the output of invertor I2 will quickly change state. Thus, the value at node Y will change state almost simultaneously with a change of state of the value at node X. The value at node Y will remain constant at the gate terminal of transistor Q7 until the clock state changes to activate transistors Q6 and Q8. When the clock state changes such that CKB is low and CK is high, transistors Q6 and Q8 will turn on. With the value at node Y being "high", transistor Q7 will also turn on, thus reducing the value of output signal Z to a logic "0" which, in turn, is provided to the gate terminal of transistor Q2 in first transistor branch "A".

As should by now be apparent from the foregoing, by applying a clock signal and a clock signal compliment simultaneously to each inverter in accordance with the present invention, the inverter can be switched on and off much faster than presently known frequency divider circuits. In this manner, the inventive frequency divider circuit can be used to operate at much higher clock frequencies than frequency divider circuits currently used.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. It is the intention, therefore, to be limited only as indicated by the scope of the claims appended hereto.

What is claimed is:

1. A frequency divider circuit suitable for high frequency operation, comprising:

an invertor having an input and an output for receiving, as an input signal to said input, one of a logic 1 and a logic 0, operable for outputting, at said output, an output signal having a value of the other of the logic 1 and the logic 0;

a first transistor branch electrically connected to the input of said invertor, said first transistor branch receiving a plurality of input signals including a clock signal having a frequency and a compliment of said clock signal, and said first transistor branch operatively generating at a first transistor branch output a first transistor branch output signal having, at any given time based on values of the plurality of input signals received by said first transistor branch, a value of one of the logic 1 and the logic 0, said first transistor branch output signal being provided to said invertor input as the invertor input signal; and a second transistor branch having an output and electrically connected to the output of said invertor, said second transistor branch receiving a plurality of input signals including the clock signal, the compliment of the clock signal, and the invertor output signal for operatively producing, at the second transistor branch output, a divider circuit output signal having a frequency substantially half the frequency of the frequency of the clock signal, said divider circuit output signal being provided to said first transistor branch as another input signal of said plurality of first transistor branch input signals.

2. The frequency divider circuit of claim 1, wherein said first transistor branch comprises first, second and third transistors each having source, gate and drain terminals and arranged so that the source terminals of said first and second transistors are connected to each other at said first transistor branch output, said first transistor receives said clock signal at its gate terminal, said second transistor receives said divider circuit out put signal at its gate terminal, and said third transistor receives said complement clock signal at its gate terminal.

3. The frequency divider circuit of claim 1, wherein said second transistor branch comprises first, second and third transistors each having source, gate and drain terminals and arranged so that the source terminals of said first and second transistors are connected to each other at said second transistor branch output, said first transistor receives said complement clock signal at its gate terminal, said second transistor receives said invertor output signal at its gate terminal, and said third transistor receives said clock signal at its gate terminal.

4. The frequency divider circuit of claim 2, wherein said second transistor branch comprises first, second and third transistors each having source, gate and drain terminals and arranged so that the source terminals of said first and second transistors of the second branch are connected to each other at said second transistor branch output, said first transistor of the second branch receives said complement clock signal at its gate terminal, said second transistor of said second branch receives said invertor output signal at its gate terminal, and said third transistor of said second branch receives said clock signal at its gate terminal.

5. The frequency divider circuit of claim 2, wherein said first transistor of said first transistor branch is a PMOS transistor and said second and said third transistors of said first transistor branch are NMOS transistors.

6. The frequency divider circuit of claim 3, wherein said first transistor of said second transistor branch is a PMOS transistor and said second and said third transistors of said second transistor branch are NMOS transistors.

7. The frequency divider circuit of claim 2, wherein each said first, second and third transistors of said first transistor branch has a corresponding on-resistance value and wherein the value of the on-resistance of the first transistor is larger than the sum of the values of the on-resistances of the second and third transistors.

8. The frequency divider circuit of claim 3, wherein each said first, second and third transistors of said second transistor branch has a corresponding on-resistance value and wherein the value of the on-resistance of the first transistor is larger than the sum of the values of the on-resistances of the second and third transistors.

* * * * *